(12) United States Patent
van de Beek et al.

(10) Patent No.: US 9,426,003 B2
(45) Date of Patent: Aug. 23, 2016

(54) PROXIMITY INTEGRATED CIRCUIT CARD BIAS ADJUSTMENT

(71) Applicant: NXP B.V., Eindhoven (NL)

(72) Inventors: Remco Cornelis Herman van de Beek, Eindhoven (NL); Massimo Ciacci, Den Bosch (NL); Ghiath Al-kadi, Eindhoven (NL)

(73) Assignee: NXP B.V., Eindhoven (NL)

( * ) Notice: Subject to any disclaimer, the term of this patent is extended or adjusted under 35 U.S.C. 154(b) by 11 days.

(21) Appl. No.: 14/133,267

(22) Filed: Dec. 18, 2013

(65) Prior Publication Data

US 2015/0172080 A1    Jun. 18, 2015

(51) Int. Cl.
| | | |
|---|---|---|
| *H03D 1/24* | (2006.01) | |
| *H04L 25/06* | (2006.01) | |
| *G06K 19/077* | (2006.01) | |
| *H03F 1/30* | (2006.01) | |
| *H04L 27/06* | (2006.01) | |
| *G06K 19/07* | (2006.01) | |

(52) U.S. Cl.
CPC .......... *H04L 25/06* (2013.01); *G06K 19/07771* (2013.01); *H03F 1/30* (2013.01); *G06K 19/0715* (2013.01); *H03F 2200/375* (2013.01); *H04L 27/06* (2013.01)

(58) Field of Classification Search
CPC ....................................................... H04L 25/06
USPC ........................................................ 375/320
See application file for complete search history.

(56) References Cited

U.S. PATENT DOCUMENTS

| | | | |
|---|---|---|---|
| 3,727,135 A * | 4/1973 | Holzer | 375/251 |
| 5,940,447 A | 8/1999 | Connell et al. | |
| 6,466,007 B1 * | 10/2002 | Prazeres da Costa et al. | 324/762.02 |
| 6,680,985 B1 * | 1/2004 | Strodtbeck et al. | 375/320 |
| 7,765,080 B2 * | 7/2010 | Ludwig et al. | 702/122 |
| 2004/0135673 A1 | 7/2004 | Oberhuber et al. | |
| 2004/0179510 A1 | 9/2004 | Kuffner et al. | |
| 2006/0008685 A1 | 1/2006 | Mizude et al. | |
| 2006/0276989 A1 * | 12/2006 | Ludwig et al. | 702/122 |
| 2007/0075143 A1 | 4/2007 | Higashi | |
| 2009/0032935 A1 | 2/2009 | Bhowmik et al. | |
| 2009/0033462 A1 | 2/2009 | Kitayoshi et al. | |
| 2009/0046809 A1 | 2/2009 | Meltzer | |
| 2009/0154599 A1 * | 6/2009 | Siti et al. | 375/320 |

(Continued)

OTHER PUBLICATIONS

"International Standard, ISO/IEC 14443-2, Identification cards—Contactless integrated circuit(s) cards—Proximity cards—Part 2: Radio frequency power and signal interface"; 17 pages (Jul. 1, 2001).
U.S. Appl. No. 13/736,264, filed Jan. 8, 2013, Remco van de Beek, et al.
European Search Report, 14192871.3, Apr. 8, 2015.

(Continued)

*Primary Examiner* — Qutbuddin Ghulamali

(57) ABSTRACT

A proximity integrated circuit card bias adjustment. In one example, a decoding circuit, having an decoding range, for translating a data-frame signal having an information portion and a bias portion into an output code; and a bias adjust circuit coupled to receive the output code from the decoding circuit, and adjust the bias portion of the data-frame signal such that the output code is within the decoding range is disclosed. In another example, a method for proximity integrated circuit card bias adjustment, comprising: translating a data-frame signal having an information portion and a bias portion into an output code; and adjusting the bias portion of the data-frame signal such that the output code is within a decoding range is disclosed.

18 Claims, 7 Drawing Sheets

(56) References Cited

U.S. PATENT DOCUMENTS

| | | | |
|---|---|---|---|
| 2009/0189688 A1 | 7/2009 | Nehrig et al. | |
| 2010/0158157 A1 | 6/2010 | Iwata et al. | |
| 2012/0057656 A1* | 3/2012 | Bae et al. | 375/319 |
| 2012/0083205 A1 | 4/2012 | Marcu et al. | |
| 2012/0183100 A1* | 7/2012 | Luzzi et al. | 375/320 |
| 2014/0086347 A1* | 3/2014 | Kang | 375/259 |
| 2014/0192931 A1 | 7/2014 | VandeBeek et al. | |

OTHER PUBLICATIONS

"RFID Handbook: Fundamentals and Applications in Contactless Smart Cards, Radio Frequency Indentification and Near-Field Communication—2nd Ed."; Klaus Kinkenzeller, ISBN: 0-470-84402-7, pp. 278, 2003.

van Elzakker, M. et al.; "A 1.9µW 4.4fJ/Conversion-step 10b 1 MS/s Charge-Redistribution ADC"; in ISSCC dig. Tech. Papers, Feb. 2008.

European Search Report, 13199914.6, May 21, 2014.

* cited by examiner

PROXIMITY INTEGRATED CIRCUIT CARD BIAS ADJUSTMENT

CROSS-REFERENCE TO RELATED OR CO-PENDING APPLICATION

This application incorporates by reference related co-pending U.S. patent application Ser. No. 13/736,264, entitled Near Field Communication Data Conversion With An Event-Field, filed on Jan. 8, 2013, by Remco C. van de Beek, Massimo Ciacci, and Ghiath Al-kadi. This application is commonly assigned to NXP B.V. of Eindhoven, Netherlands.

BACKGROUND

Brief Background Introduction

This specification relates generally to devices, systems and methods for communication and in one example to types of wireless communication. Further improvements to such systems, methods, and devices are desired.

SUMMARY

A proximity integrated circuit card (PICC) comprising: a decoding circuit, having an decoding range, for translating a data-frame signal having an information portion and a bias portion into an output code; and a bias adjust circuit coupled to receive the output code from the decoding circuit, and adjust the bias portion of the data-frame signal such that the output code is within the decoding range.

A method for proximity integrated circuit card bias adjustment, comprising: translating a data-frame signal having an information portion and a bias portion into an output code; and adjusting the bias portion of the data-frame signal such that the output code is within a decoding range.

A system for bias adjustment between a proximity integrated circuit card and a proximity coupling device (PCD), comprising: a decoding circuit, having an decoding range, for translating a data-frame signal having an AC portion and a DC portion into an output code; and a bias adjust circuit coupled to receive the output code from the decoding circuit, and adjust the DC portion such that the output code is within the decoding range.

The above summaries of the present disclosure are not intended to represent each disclosed example embodiment. Other aspects and example embodiments are provided in the Figures and the detailed description that follow.

Figure 1:
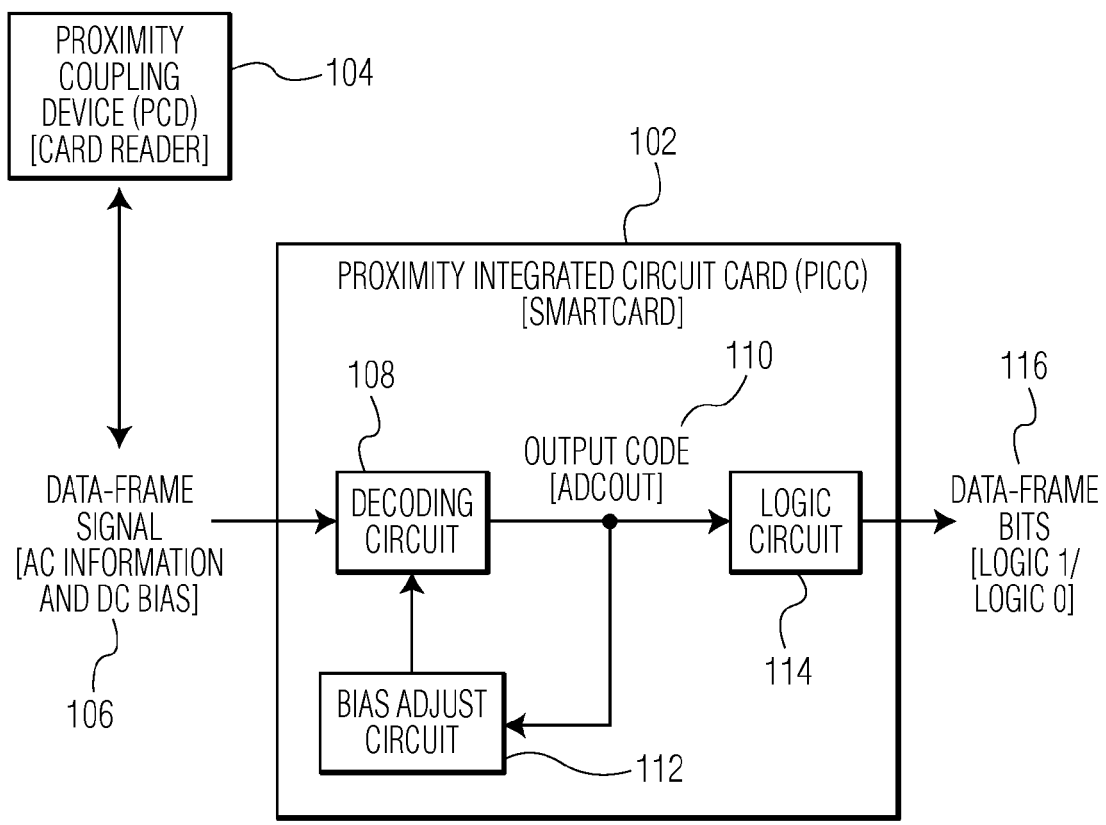
FIG. 1 is a first example of a system for bias adjustment between a proximity integrated circuit card (PICC) and a proximity coupling device (PCD)

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Smartcards and smartcard readers in some example embodiments communicate using an ISO/IEC 14443-2: 2001/Type-B standard entitled, "Identification cards—Contactless integrated circuit(s) cards—Proximity cards—Part 2: Radio frequency power and signal interface" (hereinafter the ISO/IEC standard). Various communication modes of operation are described in the ISO/IEC standard including a very-high bit rate (VHBR) mode. Amplitude Shift Keying (ASK) magnetic modulation with non-return-to-zero (NRZ) bit coding is used in some examples.

The ISO/IEC standard prescribes 5 ms startup time before the card reader should be ready to respond, during which the smartcard receives an un-modulated data-frame signal from the card reader. During this initial startup handshake, a signal strength between the card reader and the smartcard is measured. To maximize a signal-to-noise-ratio (SNR) the smartcard's gain can be set such that the un-modulated data-frame signal results in a decoder circuit reaching close to a maximum of its input range without clipping. Using ASK modulation, a logic 1 is transmitted with a 0% modulation index which is also equal to the un-modulated data-frame signal strength. Logic 0's are transmitted with a 10-20% modulation index.

After the handshake, the card reader begins to transmit information within the data-frame signal to the smartcard. If the contactless smartcard is moving very slowly with respect to the card reader (e.g. moving at a speed such that the signal strength between the smartcard and the card reader does not change significantly such that an entire frame of information can be reliably received), then the smartcard gain may be able to be reset in time to receive a next frame of information.

However, if the smartcard movement results in changes in field strength during the reception of a frame of information such that bit-errors are introduced, then resetting the gain between information frames may not prevent such bit-errors. For example, if the gain is set at a near-maximum end of the decoder circuit's range (where it is almost but not yet clipping) and the smartcard is brought closer to the card reader during the frame reception by an amount that is enough to make the ADC 212 clip, then the frame will not be correctly received.

Relative motion between the smartcard and the card reader causing field strength variations is especially a concern when the data-frame signal includes long frame sizes, which increases a chance of bit-errors. For example, the ISO/IEC standard permits a maximum 4 kByte frame size, which when combined with a minimum permitted bit rate of 106 kbit per second, results in a single frame duration which can last almost 0.4 second. In this time period, the smartcard can easily move between two extremes of the ISO/IEC standard's communication range (e.g. from several centimeters (cm) of distance to perhaps 0 cm).

During data communication between the smartcard and the card reader, modulation can be as low as 10-20% such that there is a lot of signal transmitted between the two that does not have any information at all. However if a DC bias portion is subtracted from the data-frame signal, then the modulation as seen by the decoding circuit would be much higher, since the SNR would be higher.

FIG. 1 is a first example of a system for bias adjustment between a proximity integrated circuit card (PICC) 102 and a proximity coupling device (PCD) 104. The PICC 102 in one example is a contactless smartcard 102, and the PCD 104 in one example is a card reader 104. These terms will be used interchangeably throughout the specification and so they have the same respective reference numbers. In one example embodiment the PICC 102 and PCD 104 communication using the ISO/IEC standard.

The PCD 104 transmits a data-frame signal 106 to the PICC 102. The data-frame signal 106 includes an information portion (e.g. an AC portion) and a bias portion (e.g. a DC portion), such that the modulation index as defined in ISO/IEC is 10-20% typically.

A decoding circuit 108 within the PICC 102 receives and decodes the signal 106 into an output code 110. The decoding circuit 108 has a decoding range (e.g. an upper decoding limit and a lower decoding limit), above and below which an input signal would be clipped, perhaps rendering the signal's information un-decodable.

A bias adjust circuit 112 within the PICC 102 receives the output code 110 and adjusts the bias portion of the data-frame signal 106 such that the decoding circuit 108 does not exceed its decoding range.

A logic circuit 114 within the PICC 102 then converts the output code 110 into data-frame bits 116, which in one example are logic 1's and logic 0's.

By adjusting the bias portion, both before an information portion of the data-frame signal has been received and during a time when a frame of information is being received, the bias adjust circuit 112 not only increases a signal-to-noise-ratio of the system, but also prevents bit-errors by adjusting the bias portion of the data-frame signal before each bit is received. Thus the PICC/smartcard 102 can be moved at a greater rate relative to the PCD/card reader 104 while not introducing decoding circuit 108 bit-errors.

Figure 2:
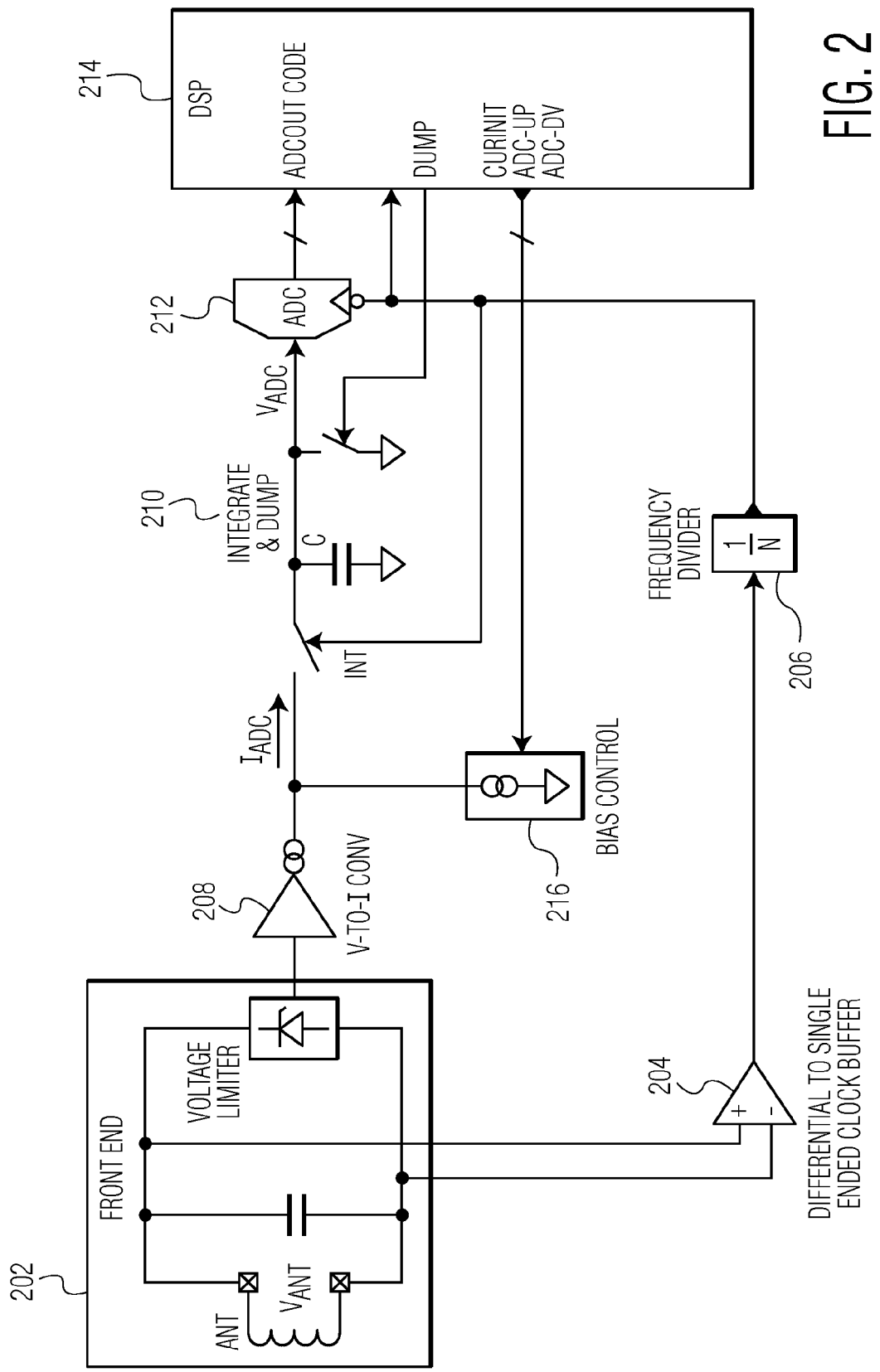
FIG. 2 is a second example of the system for bias adjustment between a proximity integrated circuit card (PICC) and a proximity coupling device (PCD)

FIG. 2 is a second example of the system for bias adjustment between a proximity integrated circuit card (PICC) and a proximity coupling device (PCD). The PICC 102 in the second system example includes: a front-end 202, a differential clock buffer 204, a frequency divider 206, a V-to-I converter 208, an integrate-and-dump circuit 210, an Analog-to-Digital-Converter (ADC) 212, a Digital-Signal-Processor (DSP) 214, and a bias control 216.

The front-end 202 of the PICC/smartcard 102 includes an antenna and a voltage limiter. The antenna in one example is an inductive loop that picks up the data-frame signal 106 emitted from the PCD/card reader 104 via mutual induction. The voltage limiter protects the PICC/smartcard 102 from damage due to high antenna voltages.

The front-end 202 is coupled to a differential clock buffer 204. The differential clock buffer 204 generates a clock from the data-frame signal 106. A frequency divider 206 receives and reduces the clock frequency from the differential clock buffer 204. The frequency divider's 206 output is routed to an integrate-and-dump circuit 210, an ADC 212, and a DSP 214.

The front-end 202 is also coupled to a voltage-to-current (V-to-I) converter 208. The V-to-I converter 208 converts a voltage from the antenna in the front-end 202 into amplified current domain peaks. The V-to-I converter's 208 gain is set so that when the PCD 104 and PICC 102 are at a greatest required communication distance (as specified by the ISO/IEC standard) and an un-modulated data-frame signal 106 is being transmitted, that the ADC 212 is close to an upper-limit of its decoding range (i.e. close to an upper signal clipping limit).

An integrate-and-dump circuit 210 receives the V-to-I converter's 208 IADC current output. One example of the integrate-and-dump circuit 210 includes an integrate switch (int), a capacitor (C), and a dump switch. The integrate-and-dump circuit 210 integrates the IADC current from the V-to-I converter 208 using capacitor (C) into an output voltage (VADC) when the integrate switch is closed in response to a signal from the frequency divider 206. Closure of the integrate switch is timed such that an output voltage (VADC) is generated for each bit-period in the data-frame signal 106. The sign of the voltage (VADC) on the capacitor (C) depends upon the sign/direction of the output current (IADC). The integrate switch (int) opens at a time which maximizes VADC before a next bit-period begins.

The ADC 212 is coupled to receive VADC from the integrate-and-dump circuit 210 and the frequency divider's 206 synchronization signal. Proximate to a time that the frequency divider 206 commands the integrate switch (int) to open, the frequency divider 206 signal triggers the ADC 212 to translate the analog voltage (VADC) on the capacitor into a multi-bit digital domain ADCOUT code.

The DSP 214 is coupled to receive the ADCOUT code from the ADC 212 and timing signals from the frequency divider 206 and perhaps directly from the differential clock buffer 204. Using these timing signals the DSP 214 synchronizes with the data-frame signal's 106 timing and thereby knows when the ADCOUT code has settled and is valid. The DSP 214 may also have its own internal clock.

After capturing the ADCOUT code, the DSP 214 commands the dump switch to close momentarily and discharge the capacitor (C) in preparation for a next bit-period integration by the capacitor (C) of the IADC current from the V-to-I converter 208. In some example embodiments, the DSP 214 also tunes the frequency divider 206 to find an optimum integrate-and-dump circuit 210 frequency or phase. The DSP 214 forms part of the logic circuit 114 that converts the ADCOUT code into the logic 1's and logic 0's in the data-frame bits 116.

The bias control 216 is coupled to receive a CURINIT, ADC-UP and ADC-DN command from the DSP 214, and is coupled to receive a bias current from the V-to-I converter 208. In response to these commands from the DSP 214, the bias control 216 adjusts the DC bias portion of the V-to-I converter's 208 output current (IADC) such that the ADC's 212 ADCOUT code is within the ADC's 212 decoding range. Specific operational effects of the CURINIT, ADC-UP and ADC-DN commands on the bias control 216 are discussed below with FIG. 5. Adjustment of this DC bias portion of the data-frame signal 106 enables the ADC 212 to properly decode the AC information portion of the data-frame signal 106 even as the data-frame signal 106 varies between the PICC/smartcard 102 and the PCD/card reader 104.

Thus the bias control 216, under the command of the DSP 214, acts as a variable V-to-I converter 208 current sink which prevents the ADC 212 from clipping the information portion of the data-frame signal 106 at either a high-end of the ADC's 212 decoding range or a low-end of the ADC's 212 decoding range. The adjustment of the DC bias allows for a larger signal-to-noise ratio (SNR) at the ADC 212 thereby enabling a more accurate ADCOUT code for each data-frame signal 106 bit-period. The gain of the V-to-I converter 208 can be constant and does not need to be varied as the distance and signal strength between the PICC 102 and the PCD 104 varies.

Without any data-frame signal 106 bias control, the V-to-I converter's 208 output current would include a large DC bias current on top of the 10-20% modulation index information portion of the data-frame signal 106. Removal of this DC bias current portion (i.e. bias current component), allows the V-to-I converter's 206 fixed amplification/gain to be at a sufficiently high level to meet the most stringent requirements of the ISO/IEC standard, without exceeding the ADC's 212 decoding range (i.e. signal clipping). The bias can be adjusted as often as every data-frame signal 106 bit-period.

Figure 3:
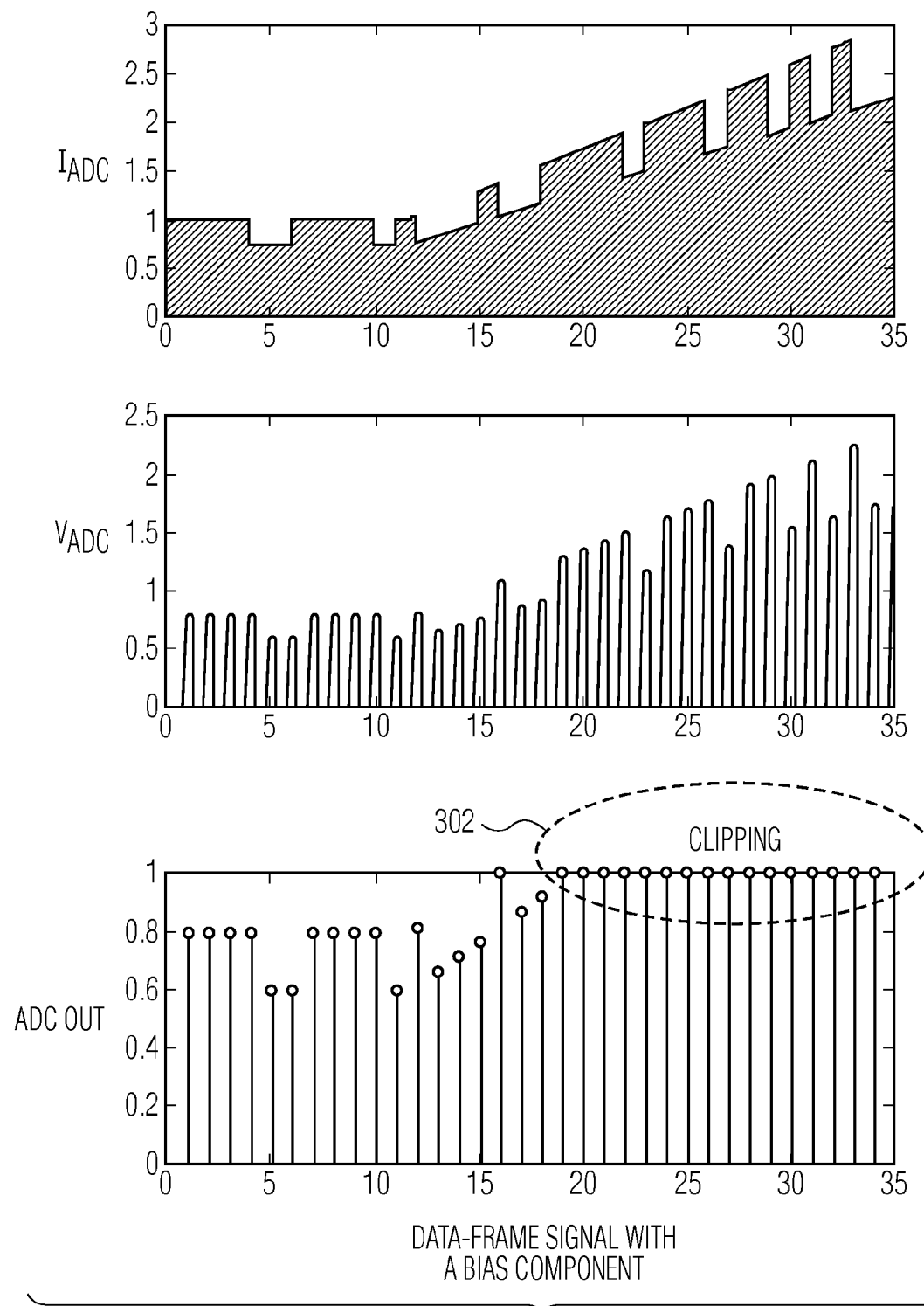
FIG. 3 is an example data-frame signal without bias adjustment.

FIG. 3 is an example data-frame signal 106 without bias adjustment. At the top of FIG. 3 the IADC current out of the V-to-I converter 208 is shown with an AC information portion of the data-frame signal 106 oscillating between logic 1 and logic 0 states. The IADC current also shows a DC bias component which is level from a time "0" until a time "10", such as would occur if a PICC/smartcard 102 is being held at a constant distance from the PCD/card reader 104. However, the IADC current then shows the DC bias component linearly increasing from the time "10" until a time "35", such as would occur if the PICC/smartcard 102 is being moved closer to the PCD/card reader 104.

The integrate-and-dump circuit 210 converts IADC current into the VADC voltage which is shown in the middle of FIG. 3. The ADC 212 then decodes the VADC voltage into an ADCOUT code, shown at the bottom of FIG. 3. Because this example data-frame signal 106 does not include bias adjustment, clipping 302 of the ADCOUT code occurs from a time "19" through time "35" since the VADC voltage has caused the ADC 212 to exceed its decoding range. During clipping 302 the logic 1 and logic 0 information portion of the data-frame signal 106 is lost as the PICC/smartcard 102 is being moved closer to the PCD/card reader 104.

Figure 4:
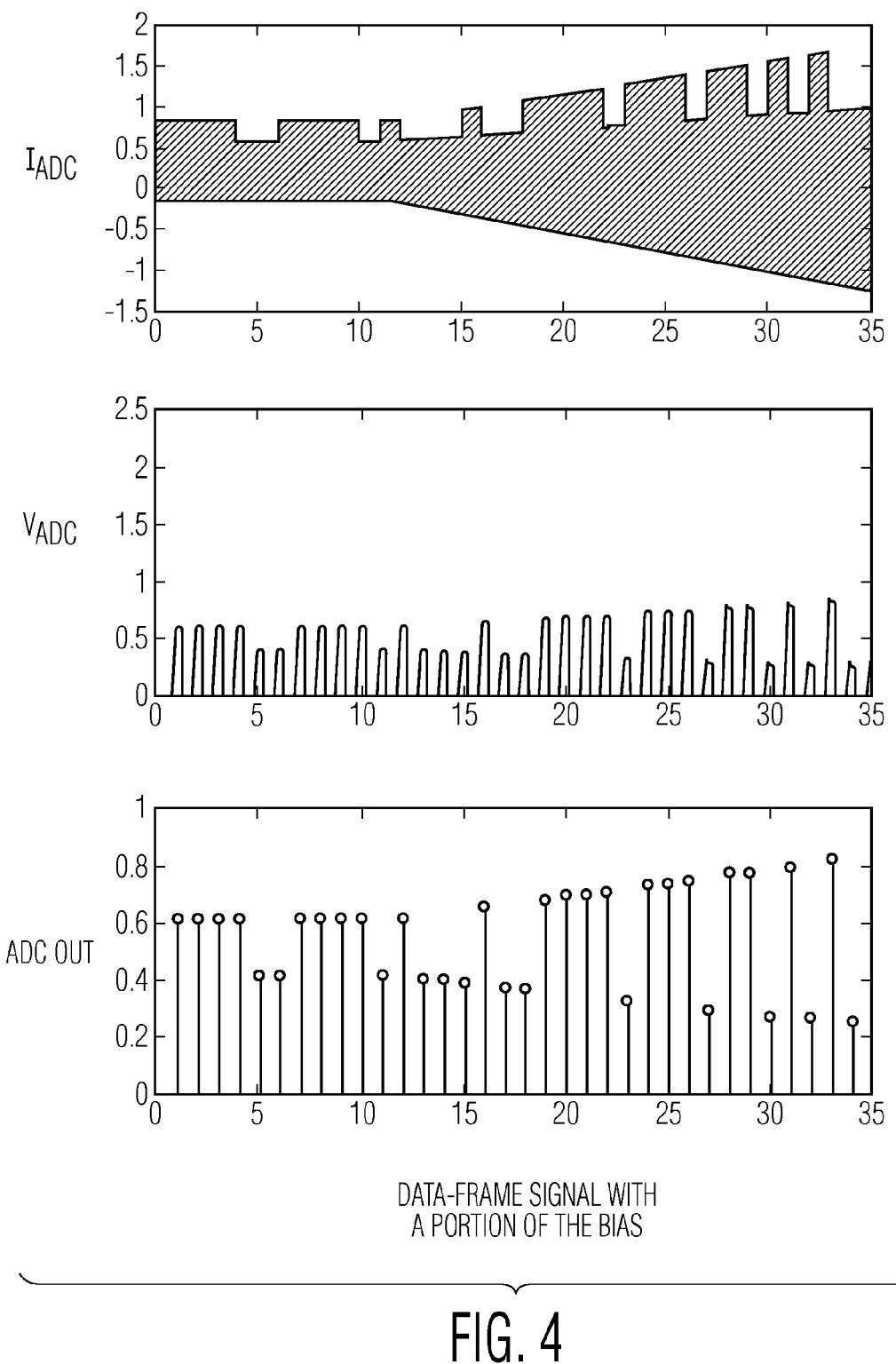
FIG. 4 is an example data-frame signal with bias adjustment.

FIG. 4 is an example data-frame signal 106 with bias adjustment. At the top of FIG. 4 the IADC current out of the V-to-I converter 208 is shown with the same AC information portion of the data-frame signal 106 as shown in FIG. 3; however, a portion of the DC bias component has been subtracted from a time "0" until a time "10". This bias portion is subtracted to improve the SNR into the ADC 212, even when the PICC/smartcard 102 is being held at a constant distance from the PCD/card reader 104. From the time "10" until a time "35", as the PICC/smartcard 102 is being moved closer to the PCD/card reader 104, a linearly increasing bias portion is subtracted from the V-to-I converter's 208 output current such that the IADC current into the integrate-and-dump circuit 210 remains relatively level.

The middle of FIG. 4 shows that because the bias adjustment is subtracting a variable portion of the V-to-I converter's 208 output current, the VADC is kept relatively level and stable. The ADC 212 then decodes the VADC voltage into an ADCOUT code, shown at the bottom of FIG. 4. Because this example data-frame signal 106 includes bias adjustment, there is no clipping of the ADCOUT code at any time since the bias adjustment has kept VADC within the ADC's 212 decoding range. This preserves the logic 1 and logic 0 information portion of the data-frame signal 106 even as the PICC/smartcard 102 is being moved closer to the PCD/card reader 104.

Figure 5:
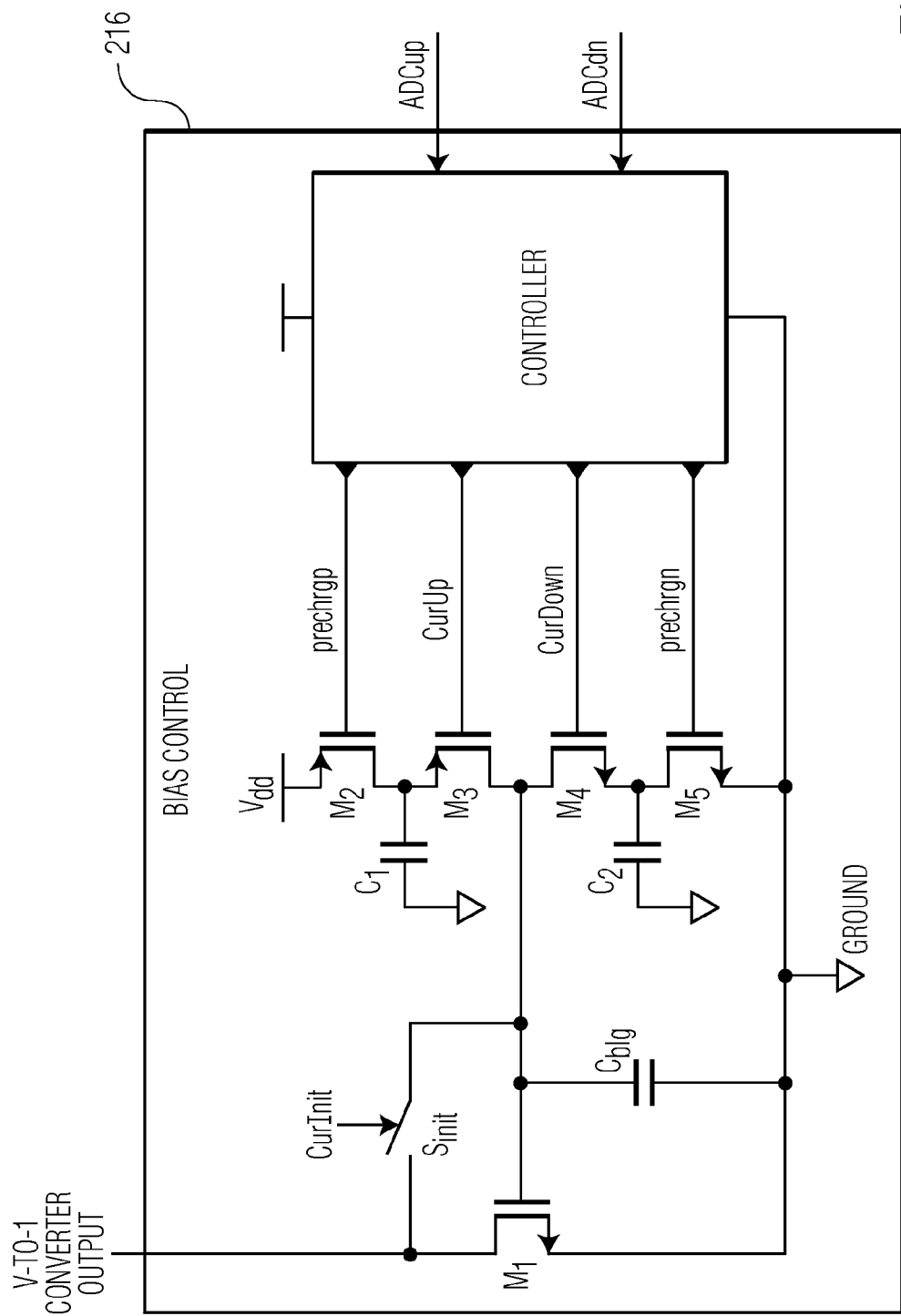
FIG. 5 is an example bias control circuit within the second example system.

FIG. 5 is an example bias control 216 circuit within the second example system. An NMOS transistor M-1 variably sinks output current from the V-to-I converter 208 in dependence upon its gate voltage. The charge on Cbig capacitor sets M-1's gate voltage. Cbig's charge can be varied either by closure of the Sinit switch by the CURINIT signal from the DSP 214, or by the ADC-UP and ADC-DN signals sent to the bias control's 216 controller which in response control M-2, M-3, M-4 and M-5. The circuitry around M-2 through M-5 either take away charge from Cbig (the amount being proportional to the ratio of C-2/Cbig) or add charge (proportional to $C_1$/Cbig), thereby changing the output current subtracted from the V-to-I converter 208 by M-1.

For example, when more current needs to be subtracted from the V-to-I converter 208 output, as indicated by an ADC-DN command from the DSP 214, first the controller "prechrgp" is set to 0 V, thereby activating M-2, which charges $C_1$ (which can be implicitly present as "parasitic" capacitance of transistors M-2 and M-3 instead of being a separate device) to a voltage of V-dd. To transfer the charge on $C_1$ to Cbig, "precharge" returns to the neutral setting of V-dd by inactivating (i.e. turning off) switch M-2 after which switch M-3 is activated (i.e. turning on) by making "CurUp" equal to 0 V. The charge across $C_1$ and Cbig then redistributes in a way that increases the voltage across Cbig.

When less current needs to be subtracted from the V-to-I converter 208 output, as indicated by an ADC-UP command from the DSP 214, switches M-4 and M-5 are operated in a similar fashion (first discharging C-2 to 0 V by making "prechrgn" equal to V-dd, then moving some charge from Cbig to C-2 by activating switch M-4 (i.e. turning on)).

As introduced above, switch Sinit is driven by the DSP 214 signal "CURINIT" and allows fast settling of the current subtracted from the V-to-I converter 208 output to the current output by the V-to-I converter 208. This enables the bias control 216 to quickly subtract a DC bias current from the V-to-I converter 208, which is later fine-tuned and variably adjusted in response to the ADC-UP and ADC-DN commands as discussed above.

When the integrate-and-dump circuit 210 switch (int) is open and bias control 216 switch Sinit is closed (i.e. activated), transistor M-1 is in so-called "diode" configuration. Thus, after the Cbig voltage has stabilized, the gate voltage of M-1 will be such that its drain current equals the average current out of the V-to-I converter 208. Then, when opening (i.e. deactivating) Sinit, capacitor Cbig will maintain its voltage and the current through M-1 will remain equal to the average of the V-to-I converter 208 output current until the DSP 214 uses the ADC-UP and ADC-DN input lines to change it.

In an alternate example embodiment, the bias control 216 is a current-domain Digital-to-Analog Converter (DAC) which responds to ADC-UP and ADC-DN in a manner similar to that discussed above.

Figure 6:
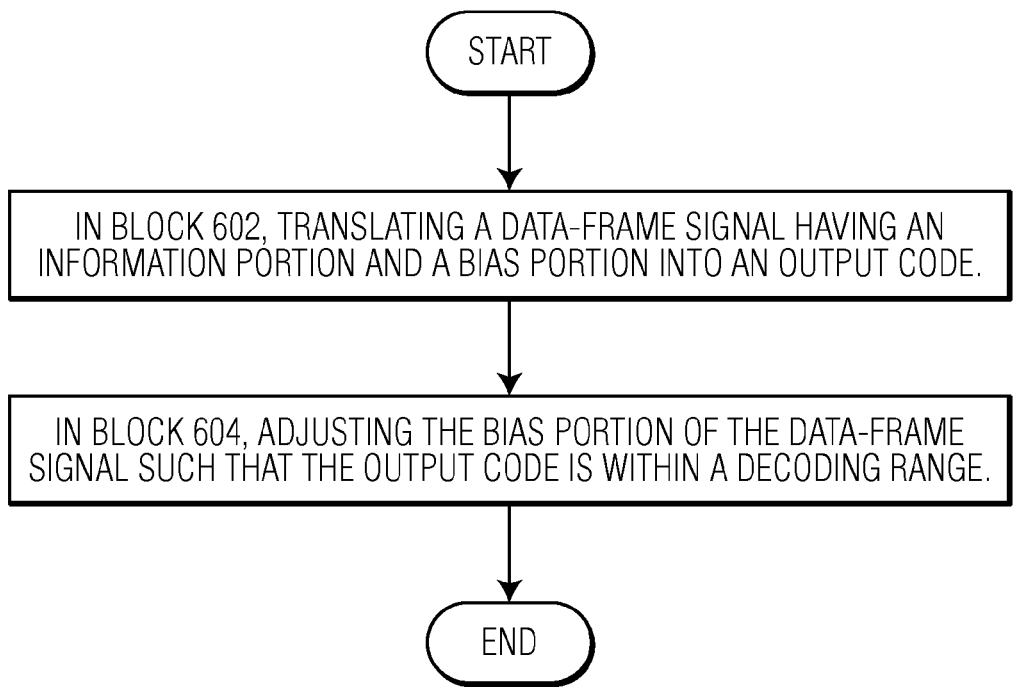
FIG. 6 is a first example of a flowchart for implementing a method for bias adjustment within a proximity integrated circuit card.

FIG. 6 is a first example of a flowchart for implementing a method 600 for bias adjustment within a proximity integrated circuit card. In block 602, translating a data-frame signal having an information portion and a bias portion into an output code. In block 604, adjusting the bias portion of the data-frame signal such that the output code is within a decoding range.

Figure 7:
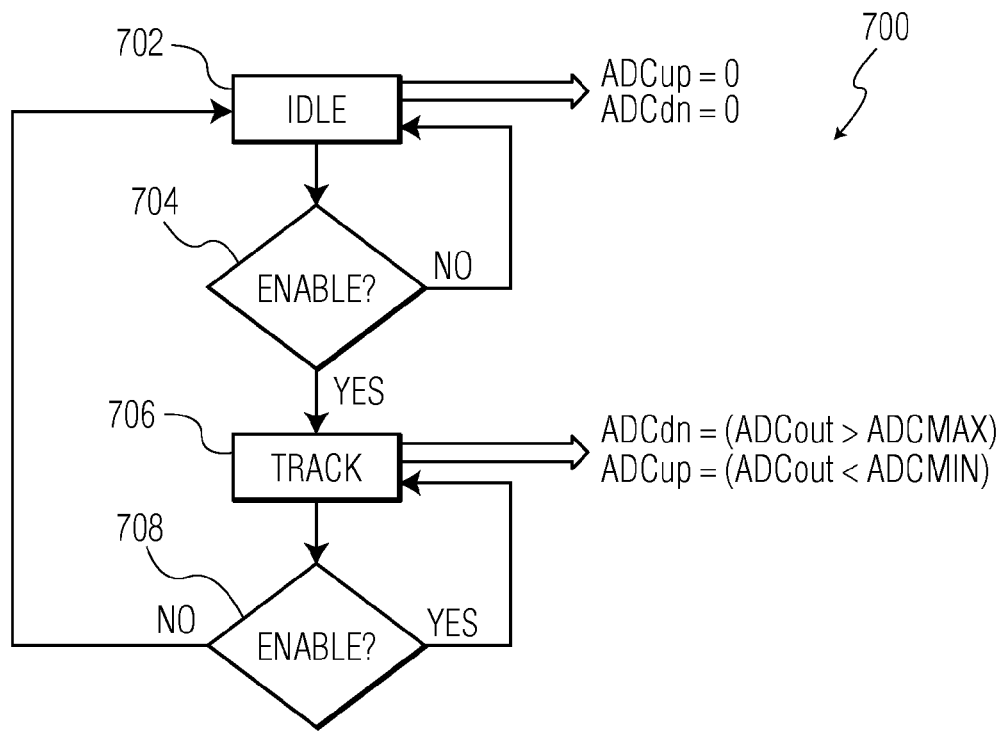
FIG. 7 is a second example of a flowchart for implementing a method for bias adjustment within a proximity integrated circuit card.

FIG. 7 is a second example of a flowchart for implementing a method 700 for bias adjustment within a proximity integrated circuit card 102. In this example, the method's 700 instructions are executed by the DSP 214 commanding the bias control 216. The DSP's 214 input signals include: a clock signal from the frequency divider; and the ADC's 212 digitized output code 110 (i.e. ADCOUT). The DSP's 214 output signals include: ENABLE, ADC-UP and ADC-DN, and a DUMP command sent to the integrate-and-dump circuit 210. This method 700 begins whether or not the receiver is waiting for a frame or currently receiving a frame. The method 700 does not make use of CURINIT signal for fast initialization of the bias control 216.

Idle-State 702 and ENABLE Check 704

Upon power up of the PICC 102, or after an end-of-frame symbol from a prior data-frame, the method 700 enters an Idle-State 702. In the Idle-State 702 the DSP 214 keeps ADC-UP and ADC-DN in an inactive-state (e.g. zero, off, etc.). The DSP 214 also defines a threshold for translating ADCOUT codes from the ADC 212 to either logic 1 or logic 0, as equal to an average of a last received ADCOUT corresponding to a logic 1 and a last received ADCOUT corresponding to a logic 0. This threshold varies as the data-frame signal 106 strength varies and as the bias control 216 adjusts the bias portion of the data-frame signal. The threshold is used by the logic circuit 114 to convert the ADCOUT codes into corresponding to data-frame bits of either logic 1 or logic 0.

An ENABLE check 704 determines if an ENABLE signal has been received from the DSP 214 and indicates that the DSP 214 is now ready for the reception of a data-frame from the PCD 104. In another example, the ENABLE signal is derived from the clock signal received from the frequency divider. Upon receipt of the ENABLE signal, the method 700 transitions into a Track-State 706.

Track-State 706

During the Track-State 706, the ADC 212 decodes integrated voltages into ADCOUT codes which the DSP 214 converts into corresponding to data-frame bits of either logic 1 or logic 0. During the Track-State 706, even though the PCD's/card reader's 104 signal strength might vary (e.g. perhaps as the PICC/smartcard 102 is either moved closer to or further from the PCD 104) the ADC 212 can still properly decode the data-frame signal 106.

During the Track-State 706, the DSP 214 attempts to keep the ADC 212 output values above an ADCMIN code and below an ADCMAX code. ADCMIN and ADCMAX codes are selected so that for a given data-frame the corresponding logic 1 and logic 0 values of ADCOUT would not clip either the bottom or the top range of ADCOUT codes. The ADCMIN and ADCMAX codes are pre-stored in a memory based on the ADC's 212 known decoding range and output codes. The ADCMIN code is higher (e.g. perhaps just slightly higher) than the ADC's 212 absolute minimum output (i.e. the low end of the ADC's 212 decoding range, below which signal clipping would occur). The ADCMAX code is lower (e.g. perhaps just slightly lower) than the ADC's 212 absolute maximum output (i.e. the high end of the ADC's 212 decoding range, above which signal clipping would occur).

Whenever the ADC's 212 ADCOUT code equals or falls below ADCMIN, the DSP 214 sends an ADC-UP signal to the bias control 216 to remove less bias (e.g. V-to-I converter 208 DC bias current) from the data-frame signal 106, and as a result the ADCOUT values will increase. Whenever the ADC's 212 ADCOUT code equals or falls above ADCMAX, the DSP 214 sends an ADC-DN signal to the bias control 216 to remove more bias from the data-frame signal 106, and as a result the ADCOUT values will decrease.

Thus ADCOUT is used not only to enable the DSP 214 to generate the logic 1 and logic 0 bits, but also to keep the ADCOUT code from going too high (i.e. high-end clipping), or too low (i.e. low-end clipping) within the ADC's 212 decoding range. In block 708, if the ENABLE signal is no longer being received from the DSP 214, the method 700 returns to the Idle-state 702.

In summary, in the Track-State 706 the DSP 214 commands the bias control 216 to vary a current subtracted from the V-to-I converter 208 in response to changes in the antenna field strength between the PICC 102 and the PCD 104.

Figure 8:
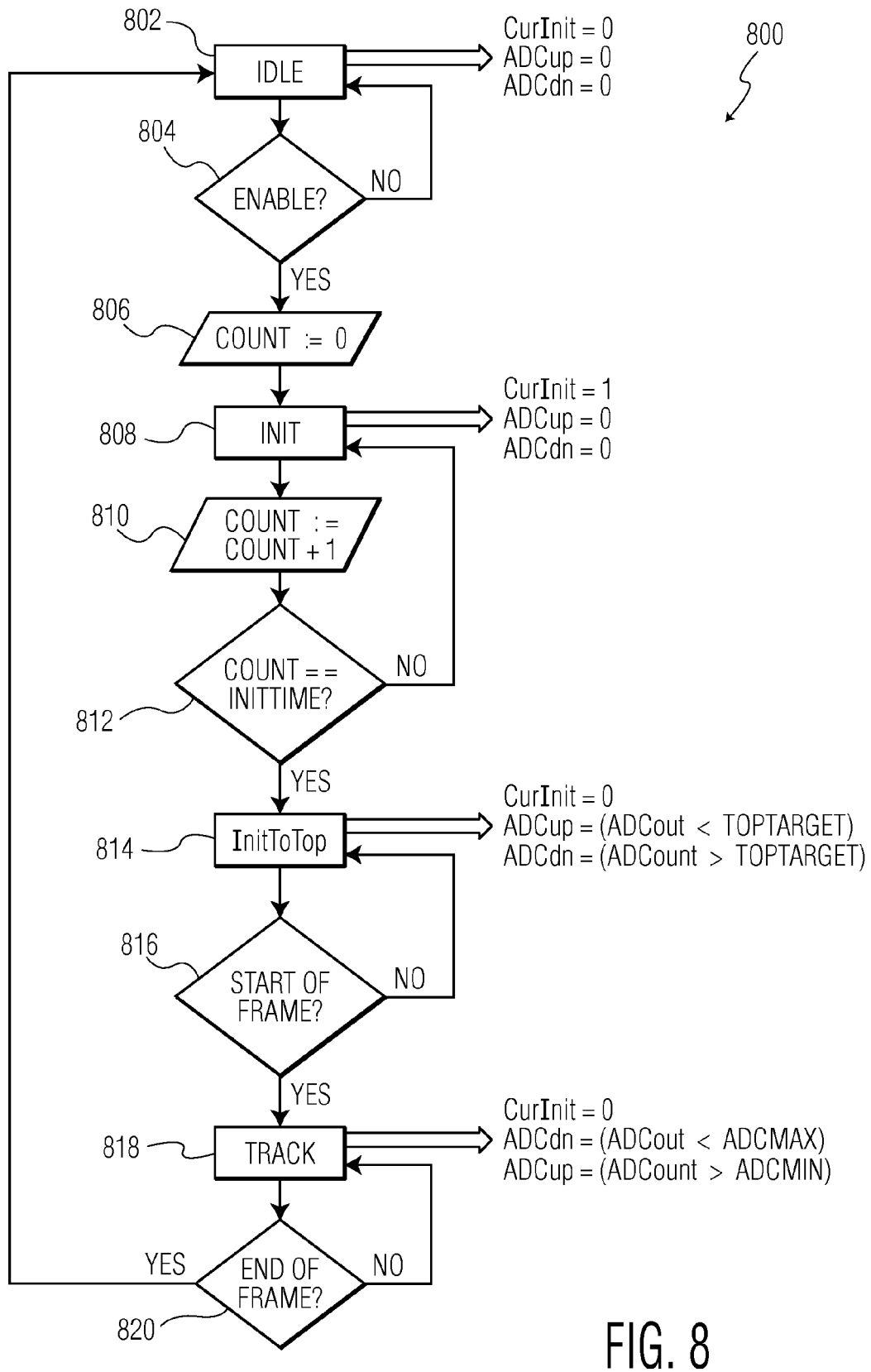
FIG. 8 is a third example of a flowchart for implementing a method for bias adjustment within a proximity integrated circuit card.

FIG. 8 is a third example of a flowchart for implementing a method 800 for bias adjustment within a proximity integrated circuit card 102. In this example, the method's 800 instructions are also executed by the DSP 214 commanding the bias control 216. The DSP's 214 input signals include: a clock signal from the frequency divider; and the ADC's 212 digitized output code 110 (i.e. ADCOUT). The DSP's 214 output signals include: ENABLE, CURINIT (Current Initialize), ADC-UP and ADC-DN, and a DUMP command sent to the integrate-and-dump circuit 210.

Idle-State 802 & ENABLE Check 804

Upon power up of the PICC 102 or after an end-of-frame symbol from a prior data-frame, the method 800 enters an Idle-State 802. In the Idle-State 802 the DSP 214 keeps CURINIT, ADC-UP and ADC-DN in an inactive-state (e.g. zero, off, etc.). An ENABLE check 804 determines if an ENABLE signal has been received from the DSP 214 and indicates that the DSP 214 is now ready for the reception of a data-frame from the PCD 104. In another example, the ENABLE signal is derived from the clock signal received from the frequency divider. Upon receipt of the ENABLE signal, COUNT is reset to zero in block 806, and the method 800 transitions into an Init-State 808.

Init-State 808

In one example embodiment, the Init-State 808 is scheduled to occur after an end-of-frame symbol in the data-frame signal 106, but before a start-of-frame symbol in the data-frame signal 106. During this time the data-frame signal 106 received from the PCD 104, is un-modulated, causing the V-to-I converter 208 output current to be at a highest value which the ADC 212 reads as a voltage. At this time the DSP 214 sets the CURINIT to an active-state (e.g. logic 1, on, etc.) which closes the S-INIT switch, thereby permitting the V-to-I converter's output current to charge the bias control's 216 C-big capacitor, shown in FIG. 5.

The DSP 214 remains in the Init-State 808 for a fixed amount of time (e.g. until COUNT equals INITTIME which is on the order of microseconds) which allows the C-big capacitor to be, in one example, fully charged. Various other intermediate states of charge are possible in other example embodiments. At completion of the Init-State 808, the bias control 216 is now set to subtract an initial amount of current from the V-to-I converter, which removes a significant part of the data-frame signal's 106 DC bias component. As is discussed below, the bias control's 216 current subtraction setting is later refined using ADC-UP and ADC-DN when information is received within the data-frame signal 106. However, for now the DSP 214 keeps ADC-UP and ADC-DN inactive (e.g. logic 0).

InitToTop-State 814

After the COUNT variable has reached INITTIME but while the data-frame signal is still un-modulated, the method 800 transitions into an InitToTop-State 814. In the InitToTop-State 814 the DSP 214 sets the CURINIT to an inactive-state thereby causing the S-INIT switch in FIG. 5 to open.

A previously defined TOPTARGET code is defined as a multi-bit ADCOUT code close to a top of the ADC 212 decoder's output range (e.g. if a maximum ADCOUT code is all logic 1's, then the TOPTARGET code will include one or more logic 0's). The TOPTARGET code is slightly lower than an absolute ADC 212 maximum output so that the DSP 214 can removed additional DC bias from the data-frame signal 106 before the ADC 212 starts clipping, thereby potentially causing data-frame signal 106 information to be lost.

The DSP 214 then observes the ADCOUT code from the ADC 212 and controls the ADC-UP and ADC-DN signals, sent to the to the bias control 216, until the ADCOUT code is equal to the TOPTARGET code. The ADC 212 output code is set equal to TOPTARGET before information is received within the data-frame signal 106, since once information is transmitted within the data-frame signal 106, the ADC 212 code will drop to a lower code value.

Start-of-Frame Check 816

The ISO/IEC-Standard defines a start-of-frame symbol as a logic 0 for 10-11 bit-periods. Other start-of-frame symbols are possible. In block 816, the DSP 214 detects the start-of-frame symbol when ADCOUT drops from TOPTARGET to a lower code value. This lower ADCOUT code is not all logic 0's so that clipping at the bottom of the ADC's range can be detected and avoided.

As introduced earlier, the DSP 214 defines a threshold for translating ADCOUT codes to either logic 1 or logic 0, as equal to an average of a last received ADCOUT corresponding to a logic 1 and a last received ADCOUT corresponding to a logic 0. This threshold varies as the data-frame signal 106 strength varies and as the bias control 216 adjusts the bias portion of the data-frame signal. The threshold is used by the logic circuit 114 to convert the ADCOUT codes into corresponding to data-frame bits of either logic 1 or logic 0.

Before the start-of-frame, the threshold is based on an average of TOPTARGET (which is known to be a logic 1), and the start-of-frame symbol (which is known to be a logic 0). The threshold is then adjusted up or down after each data-frame bit 116 is decoded as either a logic 1 or logic 0. In other words, the DSP 214 uses the ADC 212 ADCOUT code from a prior data-frame bit 116 to decide if the ADC 212 ADCOUT code from a next data-frame bit 116 is to be identified as a logic 1 or a logic 0. In response to detection of this start-of-frame symbol and after the DSP 214 calculates the threshold, the method 800 transitions to a Track-State 818.

Track-State 818

During the Track-State 818, the ADC 212 decodes integrated voltages into ADCOUT codes which the logic circuit 114, using the earlier described threshold, converts into corresponding to data-frame bits of either logic 1 or logic 0, in one example embodiment. During the Track-State 818, even though the PCD's/card reader's 104 signal strength might vary (e.g. perhaps as the PICC/smartcard 102 is either moved closer to or further from the PCD 104) the ADC 212 can still properly decode the data-frame signal 106.

During the Track-State 818, the DSP 214 keeps the ADC 212 output values above an ADCMIN code and below an ADCMAX code. ADCMIN and ADCMAX codes are selected so that for a given data-frame the corresponding logic 1 and logic 0 values of ADCOUT would not clip either the bottom or the top range of ADCOUT codes. The ADCMIN and ADCMAX codes are pre-stored in a memory based on the ADC's 212 known decoding range and output codes.

As discussed earlier, in one example embodiment the ADCMIN code is higher (e.g. perhaps just slightly higher) than the ADC's 212 absolute minimum output (i.e. the low end of the ADC's 212 decoding range, below which signal clipping would occur). The ADCMAX code is lower (e.g. perhaps just slightly lower) than the ADC's 212 absolute maximum output (i.e. the high end of the ADC's 212 decoding range, above which signal clipping would occur).

Whenever the ADC's 212 ADCOUT code equals or falls below ADCMIN, the DSP 214 sends an ADC-UP signal to the bias control 216 to remove less bias (e.g. V-to-I converter 208 DC bias current) from the data-frame signal 106, and as a result the ADCOUT values will increase. Whenever the ADC's 212 ADCOUT code equals or falls above ADCMAX, the DSP 214 sends an ADC-DN signal to the bias control 216 to remove more bias from the data-frame signal 106, and as a result the ADCOUT values will decrease.

Thus ADCOUT is used not only to enable the logic circuit 114 to generate the logic 1 and logic 0 bits, but also to keep the ADCOUT code from going too high (i.e. high-end clipping), or too low (i.e. low-end clipping) within the ADC's 212 decoding range.

In block 820, if an end-of-frame symbol is detected, the method 800 returns to the Idle-state 802. As mentioned earlier, the ISO/IEC-Standard also defines an end-of-frame symbol as a logic 0 for 10-11 bit-periods. Other end-of-frame symbols are possible. In block 820, if an end-of-frame symbol is not detected, the method 800 returns to the Track-state 822.

In summary, in the Track-State 818 the DSP 214 commands the bias control 216 to vary a current subtracted from the V-to-I converter 208 in response to changes in the antenna field strength between the PICC 102 and the PCD 104. In one example embodiment, the method 800 is executed each time a data-signal frame 106 is received. In other example embodiments, the method 800 may not be executed each time a data-signal frame 106 is received.

The blocks comprising the flowcharts in the above Figures can be executed in any order, unless a specific order is explicitly stated. Also, those skilled in the art will recognize that while one example method embodiment is now discussed, the material in this specification can be combined in a variety of ways to yield other examples as well. The method next discussed is to be understood within a context provided by this and other portions of this detailed description.

Functional and software instructions described above are typically embodied as a set of executable instructions which are executed on a computer which is programmed with and controlled by said executable instructions. Such instructions are loaded for execution on a processor (such as one or more CPUs). The processor includes microprocessors, microcontrollers, processor modules or subsystems (including one or more microprocessors or microcontrollers), or other control or computing devices. A processor can refer to a single component or to plural components.

In one example, one or more blocks or steps discussed herein are automated. In other words, apparatus, systems, and methods occur automatically. The terms automated or automatically (and like variations thereof) mean controlled operation of an apparatus, system, and/or process using computers and/or mechanical/electrical devices without the necessity of human intervention, observation, effort and/or decision.

In some examples, the methods illustrated herein and data and instructions associated therewith are stored in respective storage devices, which are implemented as one or more non-transient computer-readable or computer-usable storage media or mediums. The non-transient computer-usable media or mediums as defined herein excludes signals, but such media or mediums may be capable of receiving and processing information from signals and/or other transient mediums. The storage media include different forms of memory including semiconductor memory devices such as DRAM, or SRAM, Erasable and Programmable Read-Only Memories (EPROMs), Electrically Erasable and Programmable Read-Only Memories (EEPROMs) and flash memories; magnetic disks such as fixed, floppy and removable disks; other magnetic media including tape; and optical media such as Compact Disks (CDs) or Digital Versatile Disks (DVDs). Note that the instructions of the software discussed above can be provided on one computer-readable or computer-usable storage medium, or alternatively, can be provided on multiple computer-readable or computer-usable storage media distributed in a large system having possibly plural nodes. Such computer-readable or computer-usable storage medium or media is (are) considered to be part of an article (or article of manufacture). An article or article of manufacture can refer to any manufactured single component or multiple components.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A proximity integrated circuit card (PICC) comprising:
a decoding circuit, having a decoding value range, for translating a data-frame signal having an information portion and a bias portion into an output code;
a bias adjust circuit coupled to receive the output code from the decoding circuit, and adjust the bias portion of the data-frame signal such that the output code is within the decoding value range, wherein the bias adjust circuit does not adjust the information portion of the data-frame signal; and
a logic circuit coupled to the decoding circuit and for converting the output code into one of a first data-frame bit and a second data-frame bit, wherein the logic circuit includes a threshold, for translating the output code into either of the data-frame bits, which is equal to an average of a last received output code corresponding to the first data-frame bit and a last received output code corresponding to the second data-frame bit.

2. The device of claim 1:
wherein the decoding circuit is compliant with an ISO/IEC 14443-2:2001-Type-B standard.

3. The device of claim 1:
wherein the data-frame signal is Amplitude Shift Keying (ASK) modulated.

4. The device of claim 1:
wherein the decoding value range includes an upper decoding limit above which the output code can not be generated, and a lower decoding limit below which the output code can not be generated.

5. The device of claim 1:
wherein the threshold varies as the bias portion is adjusted, in response to a variation in a strength of the data-frame signal.

6. The device of claim 1, wherein the bias adjust circuit is configured to subtract a portion of an output current of a V-to-I converter.

7. A method for proximity integrated circuit card (PICC) bias adjustment, comprising:
translating a data-frame signal having an information portion and a bias portion into an output code;
adjusting the bias portion of the data-frame signal without adjusting the information portion of the data-frame signal such that the output code is within a decoding value range; and
converting the output code into one of a first data-frame bit and a second data-frame bit, comprising defining a threshold, for translating the output code into either of the data-frame bits, which is equal to an average of a last received output code corresponding to the first data-frame bit and a last received output code corresponding to the second data-frame bit.

8. The method of claim 7:
wherein the first data-frame bit is a logic 1 and the second data-frame bit is a logic 0.

9. The method of claim 7, wherein adjusting includes:
defining a minimum output code and a maximum output code within the decoding value range;
removing a first fraction of the bias portion from the data-frame signal if the output code translation is below the minimum output code; and
removing a second fraction of the bias portion from the data-frame signal if the output code translation is above the maximum output code, wherein the second fraction of the bias portion is more than the first fraction of the bias portion.

10. The method of claim 7, further comprising:
removing substantially all of the bias portion from the data-frame signal before a start-of-frame symbol in the data-frame signal is received.

11. The method of claim 7:
further comprising:
defining a maximum output code within the decoding value range; and
translating an un-modulated data-frame signal into an un-modulated output code;
wherein adjusting includes:
adjusting the bias portion of the data-frame signal such that the output code is equal to the un-modulated output code.

12. A system for bias adjustment between a proximity integrated circuit card (PICC) and a proximity coupling device (PCD), comprising:
a decoding circuit, having an decoding value range, for translating a data-frame signal having a bias portion comprising an AC portion and an information portion comprising a DC portion into an output code;
a bias adjust circuit coupled to receive the output code from the decoding circuit, and adjust the DC portion such that the output code is within the decoding value range, wherein the bias adjust circuit does not adjust the AC portion of the data-frame signal; and
a logic circuit coupled to the decoding circuit and for converting the output code into one of a first data-frame bit and a second data-frame bit, wherein the logic circuit includes a threshold, for translating the output code into either of the data-frame bits, which is equal to an average of a last received output code corresponding to the first data-frame bit and a last received output code corresponding to the second data-frame bit.

13. The system of claim 12:
wherein the proximity coupling device (PCD) is a smart-card reader; and
wherein the PICC is a contactless smartcard.

14. The system of claim 12:
wherein the bias adjust circuit removes a first fraction of the DC portion from the data-frame signal in response to an increased distance between the PCD and the PICC; and
wherein the bias adjust circuit removes a second fraction of the DC portion from the data-frame signal in response to a decreased distance between the PCD and the PICC, wherein the second fraction of the DC portion is more than the first fraction of the DC portion.

15. The system of claim 12, wherein the decoding circuit includes:
- an antenna for receiving the data-frame signal;
- a V-to-I converter which converts a signal from the antenna into an amplified current which includes the AC portion and the DC portion of the data-frame signal;
- an integrate-and-dump circuit which converts the amplified current into a voltage; and
- an Analog-to-Digital-Converter (ADC) having the decoding value range, said ADC converts the voltage into the output code.

16. The system of claim 15:
- wherein the bias adjust circuit is coupled to receive the DC portion within the amplified current from the V-to-I converter; and
- wherein the bias adjust circuit adjusts the DC portion such that the ADC's output code is within the ADC decoding value range.

17. The system of claim 15:
- wherein the V-to-I converter includes a gain, wherein the gain is fixed as the DC portion of the data-frame signal is adjusted.

18. The system of claim 12:
- wherein the bias adjust circuit is a current-domain Digital-to-Analog Converter (DAC).

* * * * *